United States Patent
Ogusu et al.

(10) Patent No.: US 8,415,662 B2
(45) Date of Patent: Apr. 9, 2013

(54) RADIATION DETECTOR HAVING A PLURALITY OF AMORPHOUS SELENIUM LAYERS

(75) Inventors: Koichi Ogusu, Hamamatsu (JP); Osamu Nakane, Hamamatsu (JP); Yasunori Igasaki, Hamamatsu (JP); Yoshinori Okamura, Nagareyama (JP); Tadaaki Hirai, Koganei (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 13/054,942

(22) PCT Filed: Jul. 23, 2009

(86) PCT No.: PCT/JP2009/063212
§ 371 (c)(1),
(2), (4) Date: Mar. 15, 2011

(87) PCT Pub. No.: WO2010/010932
PCT Pub. Date: Jan. 28, 2010

(65) Prior Publication Data
US 2011/0163305 A1 Jul. 7, 2011

(30) Foreign Application Priority Data
Jul. 25, 2008 (JP) ................... P2008-192778

(51) Int. Cl.
*H01L 29/08* (2006.01)
(52) U.S. Cl.
USPC .................................. 257/42; 257/E31.008
(58) Field of Classification Search .................. 257/42
See application file for complete search history.

(56) References Cited

U.S. PATENT DOCUMENTS

| 4,717,854 | A | * | 1/1988 | Yamamoto et al. | 313/366 |
| 4,952,839 | A | * | 8/1990 | Tanioka et al. | 313/366 |
| 5,233,265 | A | * | 8/1993 | Takasaki et al. | 313/366 |
| 5,880,472 | A | * | 3/1999 | Polischuk et al. | 250/370.09 |
| 6,723,995 | B2 | * | 4/2004 | Rougeot | 250/370.11 |
| 7,323,692 | B2 | * | 1/2008 | Rowlands et al. | 250/370.09 |
| 7,947,970 | B2 | * | 5/2011 | Irisawa et al. | 250/580 |

(Continued)

FOREIGN PATENT DOCUMENTS

| JP | 9-36341 | 2/1997 |
| JP | 2002-311144 | 10/2002 |

*Primary Examiner* — Marcos D. Pizarro
*Assistant Examiner* — Bilkis Jahan
(74) *Attorney, Agent, or Firm* — Drinker Biddle & Reath LLP

(57) ABSTRACT

An X-ray detector 1 includes: an X-ray conversion layer 17 which is made of amorphous selenium and absorbs incident radiation and generates charges; a common electrode 23 provided on a surface on the side on which radiation is made incident of the X-ray conversion layer 17; and a signal readout substrate 2 on which a plurality of pixel electrodes 7 for collecting charges generated by the X-ray conversion layer 17 are arrayed, and further includes: an electric field relaxation layer 13 provided between the X-ray conversion layer 17 and the signal readout substrate 2 and containing arsenic and lithium fluoride; a crystallization suppressing layer 11 provided between the electric field relaxation layer 13 and the signal readout substrate 2 and containing arsenic; and a first thermal property enhancement layer 15 provided between the electric field relaxation layer 13 and the X-ray conversion layer 17 and containing arsenic.

10 Claims, 10 Drawing Sheets

U.S. PATENT DOCUMENTS

2002/0148949 A1* 10/2002 Sato et al. .................. 250/214.1
2006/0033031 A1* 2/2006 Takeda et al. ............ 250/370.11
2009/0026382 A1* 1/2009 Sakamoto et al. ....... 250/370.09
2009/0246402 A1* 10/2009 Mataki et al. ................. 427/534

* cited by examiner

RADIATION DETECTOR HAVING A PLURALITY OF AMORPHOUS SELENIUM LAYERS

TECHNICAL FIELD

The present invention relates to a radiation detector.

BACKGROUND ART

A technique in the field of radiation detectors is disclosed in Patent document 1 listed below. Patent document 1 discloses a radiation detecting device including an amorphous semiconductor thick film, a voltage applying electrode, and a high-resistance film with solvent resistance and carrier selectivity disposed between the amorphous semiconductor thick film and the voltage applying electrode so as to cover the entire surface of the amorphous semiconductor thick film. Thus, the radiation detecting device of Patent document 1 includes a high-resistance film to reduce an increase in dark current even when a high bias is applied.

CITATION LIST

Patent Literature

Patent document 1: Japanese Published Unexamined Patent Publication No. 2002-311144

SUMMARY OF INVENTION

Technical Problem

However, this radiation detecting device is insufficient in heat resistance, and if it is exposed to a high-temperature environment, even after the radiation detecting device is restored to a normal temperature, dark current cannot be sufficiently suppressed. The present invention has been made in view of this problem, and an object thereof is to provide a radiation detector with improved heat resistance.

Solution to Problem

In order to solve the above-described problem, a radiation detector according to a first aspect of the invention includes a charge generating layer which is made of amorphous selenium and absorbs incident radiation and generates charges, a common electrode provided on the charge generating layer on a side on which radiation is made incident, and a signal readout substrate on which a plurality of pixel electrodes for collecting charges generated by the charge generating layer are arrayed, and further includes a first amorphous selenium layer provided between the charge generating layer and the signal readout substrate and containing arsenic and lithium fluoride, a second amorphous selenium layer provided between the first amorphous selenium layer and the signal readout substrate and containing arsenic, and a third amorphous selenium layer provided between the first amorphous selenium layer and the charge generating layer and containing arsenic.

The radiation detector of the present invention includes a first amorphous selenium layer containing arsenic (As) and lithium fluoride between the charge generating layer and the signal readout substrate. Accordingly, by capturing injected holes from the pixel electrodes by the first amorphous selenium layer, holes (positive charges) can be suppressed from being injected into the charge generating layer. Further, a third amorphous selenium layer containing arsenic is provided between the first amorphous selenium layer and the charge generating layer, and a second amorphous selenium layer containing arsenic is provided between the first amorphous selenium layer and the signal readout substrate. Accordingly, lithium fluoride (LiF) contained in the first amorphous selenium layer can be suppressed from being thermally diffused to the charge generating layer. Therefore, dark current increase due to thermal diffusion of lithium fluoride to the charge generating layer can be suppressed. Specifically, according to the radiation detector of the present invention, heat resistance is improved. Further, the first amorphous selenium layer and the second amorphous selenium layer can suppress crystallization of the charge generating layer by absorbing unevenness of the signal readout substrate, and as a result, the improved heat resistance can be stably maintained. Moreover, with a radiation detector according to a second aspect of the invention, in the radiation detector according to the first aspect, it is preferable that the respective atomic concentrations of arsenic contained in the second amorphous selenium layer and the third amorphous selenium layer are higher than the atomic concentration of arsenic contained in the first amorphous selenium layer.

Further, with a radiation detector according to a third aspect of the invention, in the radiation detector according to the first or second aspect, it is preferable that the second amorphous selenium layer and the third amorphous selenium layer contain not less than 10 atomic percent and not more than 40 atomic percent of arsenic. By containing arsenic in this concentration range in the second and third amorphous selenium layers, lithium fluoride in the first amorphous selenium layer can be effectively suppressed from being diffused. Further, in a radiation detector according to a fourth aspect of the invention, in the radiation detector according to any of the first to third aspects, it is preferable that the first amorphous selenium layer contains not less than 0.5 atomic percent and not more than 5 atomic percent of arsenic. Accordingly, an increase in dark current is suppressed.

Moreover, with a radiation detector according to a fifth aspect of the invention, in the radiation detector according to any of the first to fourth aspects, it is preferable that the first amorphous selenium layer contains not less than 0.02 weight percent and not more than 5 weight percent of lithium fluoride. Accordingly, the electric field of the first amorphous selenium layer is reduced and holes can be effectively suppressed from being injected into the charge generating layer. Further, with a radiation detector according to a sixth aspect of the invention, in the radiation detector according to any of the first to fifth aspects, it is preferable that the third amorphous selenium layer contains not less than 0 weight percent and not more than 5 weight percent of lithium fluoride. Still further, with a radiation detector according to a seventh aspect of the invention, in the radiation detector according to any of the first to sixth aspects, it is preferable that the film thickness of the second amorphous selenium layer is larger than the film thickness of the third amorphous selenium layer. Accordingly, by sufficiently absorbing unevenness of the signal readout substrate, crystallization of the first amorphous selenium layer can be sufficiently suppressed.

Advantageous Effects of Invention

According to the radiation detector of the present invention, heat resistance is improved.

DESCRIPTION OF EMBODIMENTS

Figure 1:
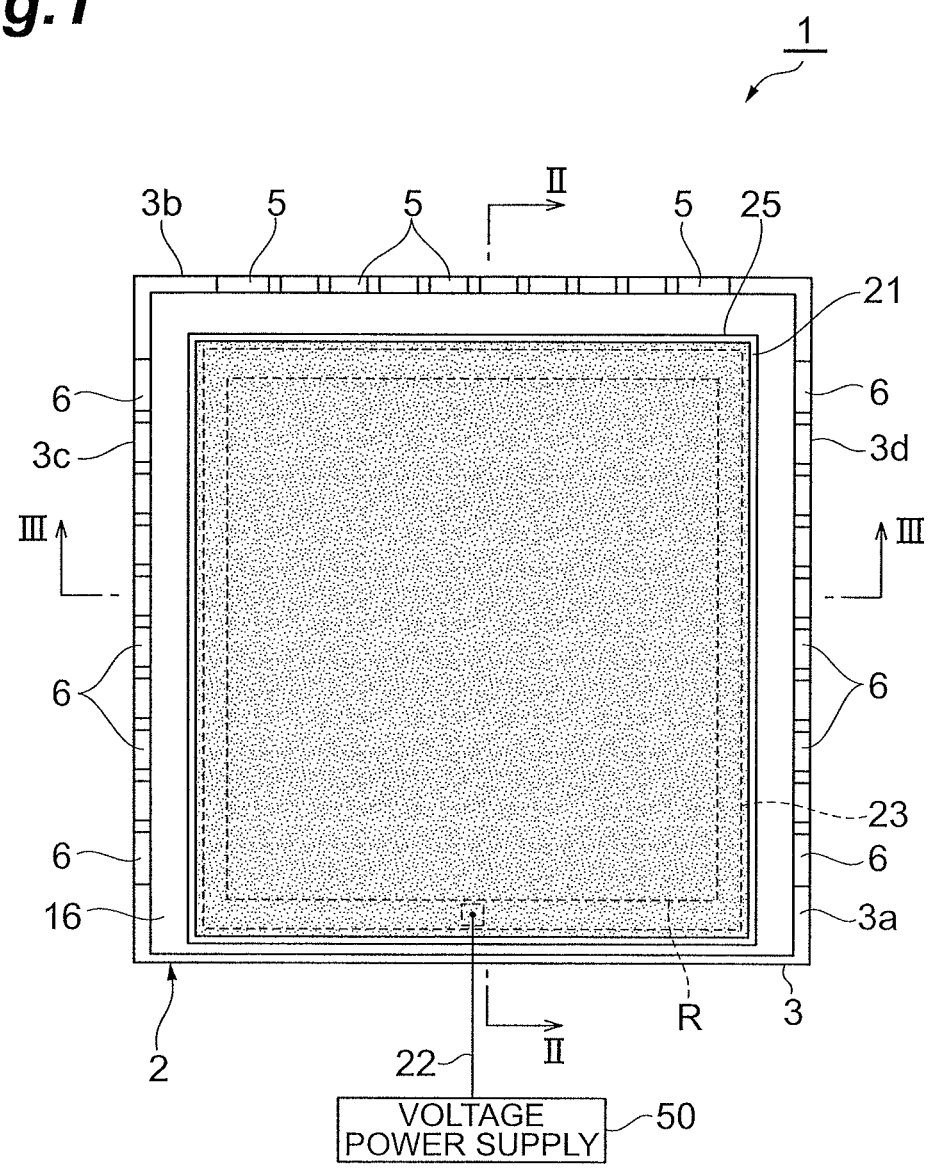
FIG. 1 is a plan view of an X-ray detector according to an embodiment of the invention.

Hereinafter, a preferred embodiment of the present invention will be described in detail with reference to the drawings. And, in the description of the drawings, elements identical to each other will be designated with the same reference numerals, and overlapping description will be omitted.

Figure 2:
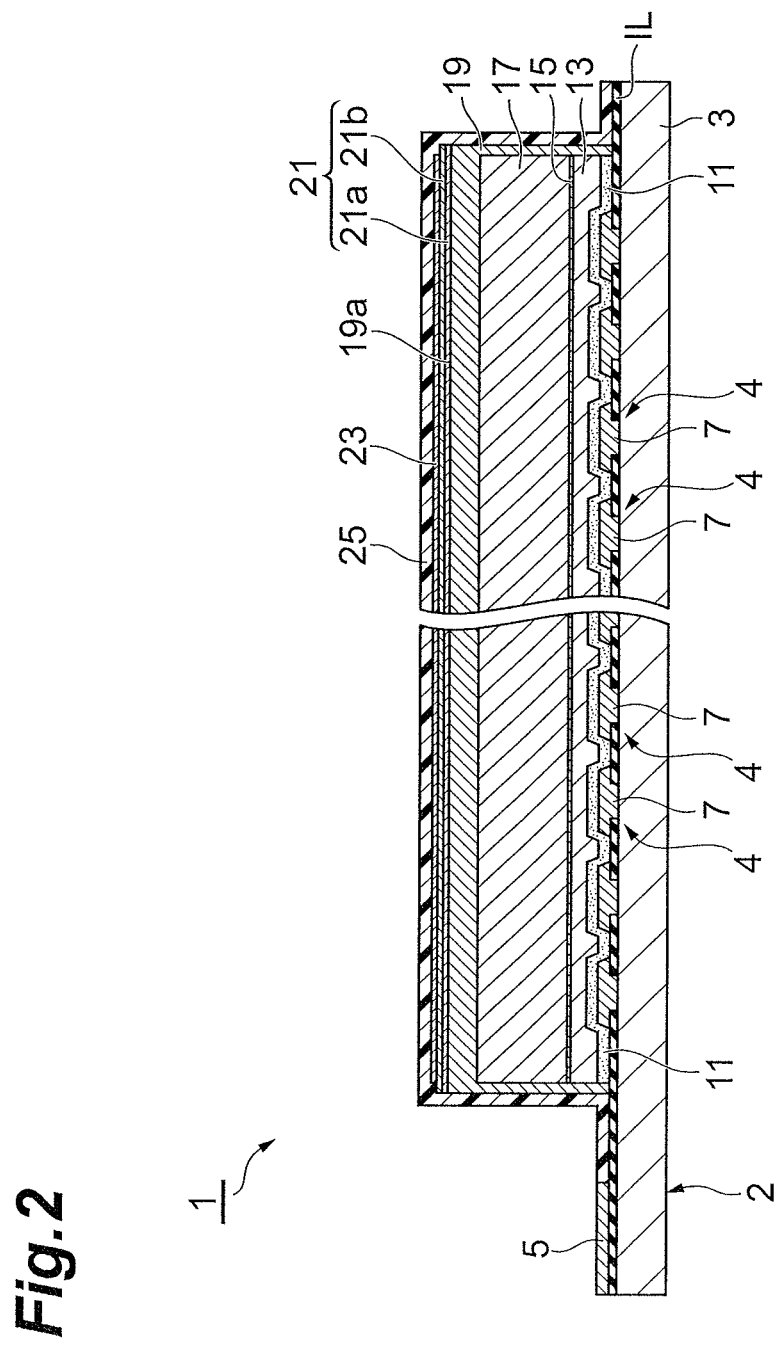
FIG. 2 is a sectional view along the II-II line shown in FIG. 1.
Figure 3:
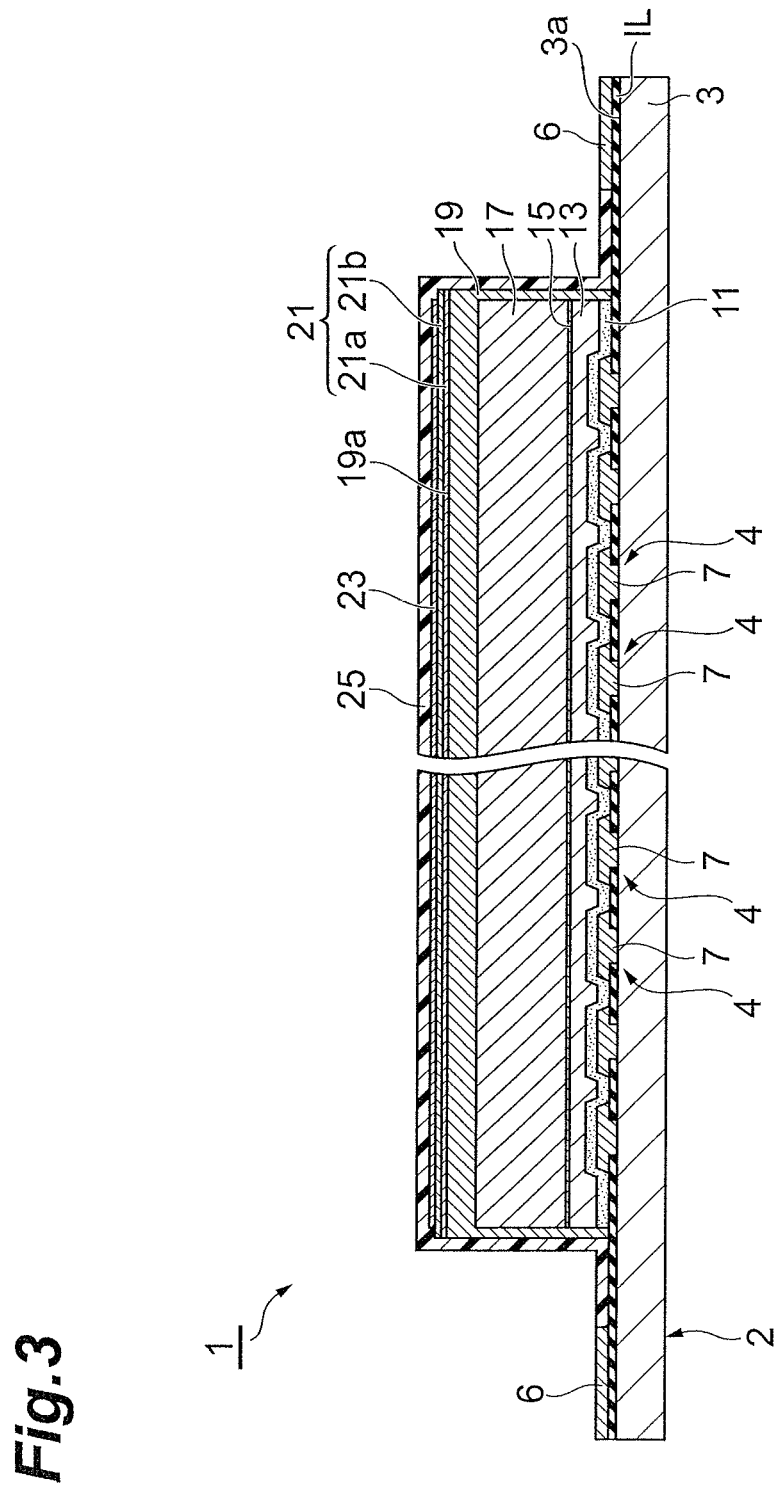
FIG. 3 is a sectional view along the III-III line shown in FIG. 1.

As shown in FIG. 1 to FIG. 3, the X-ray detector 1 according to the present embodiment is for detecting an X-ray made incident from the front side (upper side in FIG. 2 and FIG. 3), and includes a signal readout substrate 2, a crystallization suppressing layer (second amorphous selenium layer) 11, an electric field relaxation layer (first amorphous selenium layer) 13, a first thermal property enhancement layer (third amorphous selenium layer) 15, and an X-ray conversion layer (charge generating layer) 17 which are laminated in order on the signal readout substrate 2, a second thermal property enhancement layer 19 covering these layers 11, 13, 15, and 17, an electron injection blocking layer 21 (21a and 21b) and a common electrode 23 laminated in order on the second thermal property enhancement layer 19, and a protective layer 25 covering these layers 19, 21, and 23.

The signal readout substrate 2 has many pixel units 4 arrayed in a two-dimensional matrix in a rectangular effective pixel region R defined on a surface 3a of a silicon substrate 3. In the region outside the effective pixel region R on the surface 3a of the silicon substrate 3, a plurality of bonding pads 5 are formed along one side 3b of the surface 3a, and a plurality of bonding pads 6 are formed along two sides 3c and 3d neighboring the side 3b and opposed to each other, respectively. The surface regions of the silicon substrate 3 except for the bonding pads 5 and 6 and the contact hole forming regions of pixel electrodes 7 are covered by an insulating film IL made of $SiO_2$.

Figure 4:
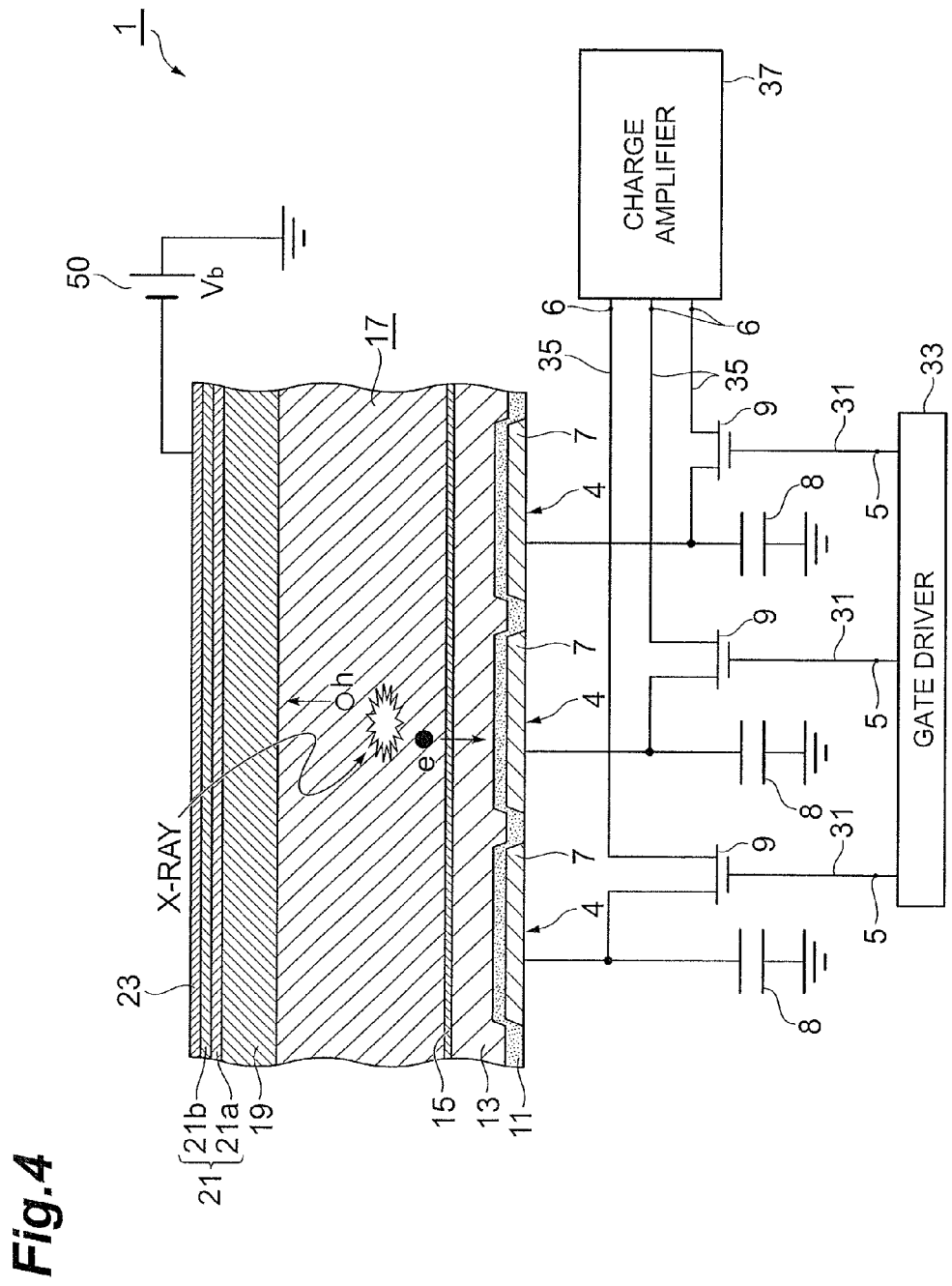
FIG. 4 is a conceptual diagram of the X-ray detector shown in FIG. 1.

As shown in FIG. 4, each pixel unit 4 includes the pixel electrode 7 for collecting charges generated by the X-ray conversion layer 17, an accumulation capacitor 8 for accumulating charges (electrons) collected in the pixel electrode 7, and a switch element 9 for reading out charges accumulated in the accumulation capacitor 8. Accordingly, on the signal readout substrate 2, many pixel electrodes 7 are arrayed in a two-dimensional matrix on the surface 3a of the silicon substrate 3. Further, the switch element 9 is, for example, a CMOS transistor.

As shown in FIG. 1 to FIG. 4, the gate of each switch element 9 is electrically connected to a gate driver 33 which turns the switch element 9 ON/OFF via a signal line 31 and a bonding pad 5. Moreover, each accumulation capacitor 8 is electrically connected to a charge amplifier 37 via the switch element 9, a signal line 35, and the bonding pad 6.

On a surface 3a of the silicon substrate 3, a crystallization suppressing layer 11 is formed. The crystallization suppressing layer 11 is made of amorphous selenium containing not less than 10 atomic percent and not more than 40 atomic percent of arsenic (As), and has excellent heat resistance. It also functions as a charge injection layer. Further, the crystallization suppressing layer 11 suppresses crystallization of the X-ray conversion layer 17 by absorbing unevenness of the signal readout substrate 2 in cooperation with the electric field relaxation layer 13, and also suppresses crystallization of the electric field relaxation layer 13. On the crystallization suppressing layer 11, the electric field relaxation layer 13, a first thermal property enhancement layer 15, and an X-ray conversion layer 17 are laminated in order.

The electric field relaxation layer 13 is made of amorphous selenium containing arsenic and lithium fluoride, and lithium fluoride contained in the electric field relaxation layer captures holes to reduce the electric field and block injection of holes into the X-ray conversion layer 17 being a pure-selenium layer. Also, the electric field relaxation layer 13 covers the crystallization suppressing layer 11 and flattens the surface. The field relaxation layer 13 preferably contains not less than 0.5 atomic percent and not more than 5 atomic percent of arsenic and not less than 0.02 weight percent and not more than 5 weight percent of lithium fluoride.

The first thermal property enhancement layer 15 is made of amorphous selenium containing arsenic, and suppresses lithium fluoride from being thermally diffused from the electric field relaxation layer 13 to the X-ray conversion layer 17. Further, the first thermal property enhancement layer 15 preferably contains not less than 10 atomic percent and not more than 40 atomic percent of arsenic. The X-ray conversion layer 17 absorbs irradiated X-rays and generates charges in proportion to the absorbed X-ray amount.

A second thermal property enhancement layer 19 is provided so as to cover the upper surface and side surfaces of a laminate consisting of these layers 11, 13, 15, and 17 provided on the signal readout substrate 2. The second thermal property enhancement layer 19 is made of amorphous selenium containing arsenic. Moreover, the second thermal property enhancement layer 19 has excellent heat resistance, so that it can suppress crystallization of the X-ray conversion layer 17 and the electric field relaxation layer 13 by covering the upper surface and side surfaces of the laminate consisting of the layers 11, 13, 15, and 17. On an upper surface 19a of the second thermal property enhancement layer 19, the electron injection blocking layer 21 and the common electrode 23 are laminated in order. Further, the protective layer 25 is provided so as to cover the upper surface and side surfaces of the laminate consisting of these layers 11, 13, 15, 17, 19, 21, and 23 provided on the signal readout substrate 2.

The electron injection blocking layer 21 consists of electron injection blocking layers 21a and 21b. The electron injection blocking layer 21a is an amorphous selenium layer containing not more than 5 atomic percent of arsenic, and the electron injection blocking layer 21b is made of antimony trisulfide. The electron injection blocking layer 21 blocks injection of electrons from the common electrode 23 into the X-ray conversion layer 17. The common electrode 23 is made of gold (Au), and a bias voltage Vb ($-10$ V/µm to $-50$ V/µm) is applied thereto by a voltage power supply 50, and an electric field is formed between the common electrode 23 and the pixel electrodes.

The protective layer 25 is made of a material with insulating properties and excellent humidity resistance such as poly-para-xylylene resin (made by ThreeBond, Co., Ltd., trade name: Parylene, etc.). Accordingly, effects are obtained such as improvement in ease in handling according to secured insulating properties, and prevention of characteristics fluctuation of the X-ray conversion layer 17 by insulation from water vapor and gas in an external atmosphere.

Moreover, the materials and thicknesses of the respective layers of the present embodiment are as follows.

Crystallization suppressing layer 11:
Material: amorphous selenium containing 40 atomic percent of arsenic
Thickness: 0.3 μm Electric field relaxation layer 13:
Material: amorphous selenium containing 2 atomic percent of arsenic and 0.15 weight percent of lithium fluoride
Thickness: 5 μm First thermal property enhancement layer 15:
Material: amorphous selenium containing 40 atomic percent of arsenic
Thickness: 0.03 μm X-ray conversion layer 17:
Material: amorphous selenium
Thickness: 200 μm Second thermal property enhancement layer 19:
Material: amorphous selenium containing 40 atomic percent of arsenic
Thickness: 0.7 μm Electron injection blocking layer 21a:
Material: amorphous selenium containing not more than 5 atomic percent of arsenic
Thickness: 0.03 μm Electron injection blocking layer 21b:
Material: antimony trisulfide
Thickness: 0.03 μm Common electrode 23:
Material: Au
Thickness: 0.05 μm Protective layer 25:
Material: poly-para-xylylene resin
Thickness: 20 μm An operation of the X-ray detector 1 configured as described above will be described. As shown in FIG. 4, when an X-ray is made incident on the X-ray conversion layer 17, in the X-ray conversion layer 17, the X-ray is absorbed and charges in proportion to the absorbed X-ray amount are generated. At this time, to the common electrode 18, a cathode of the voltage power supply 50 whose anode is grounded is connected and a bias voltage Vb (−2 kV to −10 kV) is applied, so that the charges (electrons) generated in the X-ray conversion layer 17 move along the electric field in the X-ray conversion layer 17 and are collected by the pixel electrodes 7 and accumulated in the accumulation capacitors 8. Then, the respective switch elements 9 are successively turned ON/OFF by the gate driver 33, and electrons accumulated in the respective accumulation capacitors 8 are successively readout to the charge amplifier 37 and amplified, and accordingly, a two-dimensional X-ray image is obtained.

The X-ray detector 1 of the present embodiment includes the electric field relaxation layer 13 containing not less than 0.5 atomic percent and not more than 5 atomic percent of arsenic and not less than 0.02 weight percent and not more than 5 weight percent of lithium fluoride between the X-ray conversion layer 17 and the signal readout substrate 2. The electric field relaxation layer 13 contains not less than 0.02 weight percent and not more than 2 weight percent of lithium fluoride, so that holes from the pixel electrodes 7 are captured by lithium fluoride and the holes can be suppressed from being injected into the X-ray conversion layer 17, so that an increase in dark current can be suppressed. Further, the electric field relaxation layer 13 also contains not less than 0.5 atomic percent and not more than 5 atomic percent of arsenic, so that the heat resistance is improved, and the action of lithium fluoride to suppress hole injection into the X-ray conversion layer 17 is maintained, and an increase in dark current can be suppressed.

Further, the electric field relaxation layer 13 covers the crystallization suppressing layer 11 and flattens the surface, and suppresses adverse influences of unevenness caused by the pixel electrodes, etc., of the signal readout substrate 2 on the X-ray conversion layer 17 such as crystallization and deformation of the layers, etc. Therefore, the X-ray conversion layer 17 can be made uniform across the entire region so that a uniform electric field is applied.

Moreover, the first thermal property enhancement layer 15 containing not less than 10 atomic percent and not more than 40 atomic percent of arsenic is provided between the electric field relaxation layer and the X-ray conversion layer 17, and the crystallization suppressing layer 11 containing not less than 10 atomic percent and not more than 40 atomic percent of arsenic is provided between the electric field relaxation layer 13 and the signal readout substrate 2. Accordingly, lithium fluoride in the electric field relaxation layer 13 can be effectively suppressed from being thermally diffused to the X-ray conversion layer 17. Therefore, an increase in dark current according to thermal diffusion of lithium fluoride to the X-ray conversion layer 17 can be suppressed. Further, by suppressing an increase in dark current, a high voltage can be applied to the X-ray conversion layer 17, and the characteristics of the X-ray detector 1 including the sensitivity characteristics can be improved. Radiation detectors including conventional X-ray detectors using amorphous selenium do not have sufficient heat resistance, so that these detectors require temperature control in an operation environment and a transportation environment, etc., and they must be carefully handled. However, by using the X-ray detector 1, excellent heat resistance can be secured, and the care required when handling the detector can be reduced.

Moreover, the respective atomic concentrations of arsenic in the crystallization suppressing layer 11 and the first thermal property enhancement layer 15 are higher than the atomic concentration of arsenic in the electric field relaxation layer 13. Accordingly, while maintaining the electric field relaxation effect, heat resistance of the X-ray detector is suppressed from being deteriorated and dark current can be effectively suppressed.

Also, the X-ray detector 1 includes a second thermal property enhancement layer 19 made of amorphous selenium containing arsenic and covering the layers 11, 13, 15, and 17 provided on the signal readout substrate 2. Accordingly, the heat resistance as a whole is improved, and in conjunction with the first thermal property enhancement layer 15, the function of the electric field relaxation layer 13 can be more effectively maintained and injection of holes into the X-ray conversion layer 17 can be effectively blocked.

Further, the X-ray detector 1 includes the crystallization suppressing layer 11 and the electric field relaxation layer 13, so that the crystallization suppressing layer 11 absorbs unevenness of the signal readout substrate 2 and suppresses crystallization of the X-ray conversion layer 17 in cooperation with the electric field relaxation layer 13, and suppresses crystallization of the electric field relaxation layer 13, so that improved heat resistance can be stably maintained.

Also, the crystallization suppressing layer 11 has a film thickness larger than that of the first thermal property enhancement layer 15, so that it sufficiently absorbs unevenness of the signal readout substrate 2 and suppresses crystallization of the X-ray conversion layer 17 in cooperation with the electric field relaxation layer 13, and can sufficiently suppress crystallization of the electric field relaxation layer 13.

The present invention is not limited to the above-described embodiment. For example, the radiation detector of the present invention is not limited to an X-ray detector, and may be a device for detecting electromagnetic waves (gamma rays and other light, etc.), with different wavelength regions and particle beams (alpha rays, beta rays, etc.). Further, the signal readout substrate 2 is not limited to a substrate having the plurality of pixel electrodes 7 two-dimensionally arrayed on the silicon substrate 3, and may be a substrate having the plurality of pixel electrodes 7 one-dimensionally arrayed on the front surface of the silicon substrate 3. For example, the switch element 9 in the present embodiment is a CMOS transistor, however, it may be a TFT.

Still further, the first thermal property enhancement layer does not contain lithium fluoride, however, it may contain lithium fluoride as long as the content is in a concentration range not more than 5 weight percent. Accordingly, it is expected that a more excellent electric field relaxation effect will be obtained.

Hereinafter, the present invention will be described in greater detail based on Examples and Comparative examples, however, the present invention is not limited to the following Examples at all.

[Dark Current Suppressing Effect Verification Test]
(Experiment Conditions of Example 1)

In Example 1, on a surface 3a of the silicon substrate 3 of the signal readout substrate 2, the crystallization suppressing layer 11, the electric field relaxation layer 13, and the first thermal property enhancement layer 15 were formed according to the vacuum vapor deposition method etc., using a mask (see FIG. 1 to FIG. 3). Detailed conditions of the respective layers are as follows.

Crystallization suppressing layer 11:
Material: amorphous selenium containing 40 atomic percent of arsenic
Thickness: 0.3 μm
Electric field relaxation layer 13:
Material: amorphous selenium containing 2 atomic percent of arsenic and 0.15 weight percent of lithium fluoride
Thickness: 5 μm
First thermal property enhancement layer 15:
Material: amorphous selenium containing 40 atomic percent of arsenic
Thickness: 0.03 μm (Experiment Conditions of Comparative Examples 1 and 2)

Figure 5:
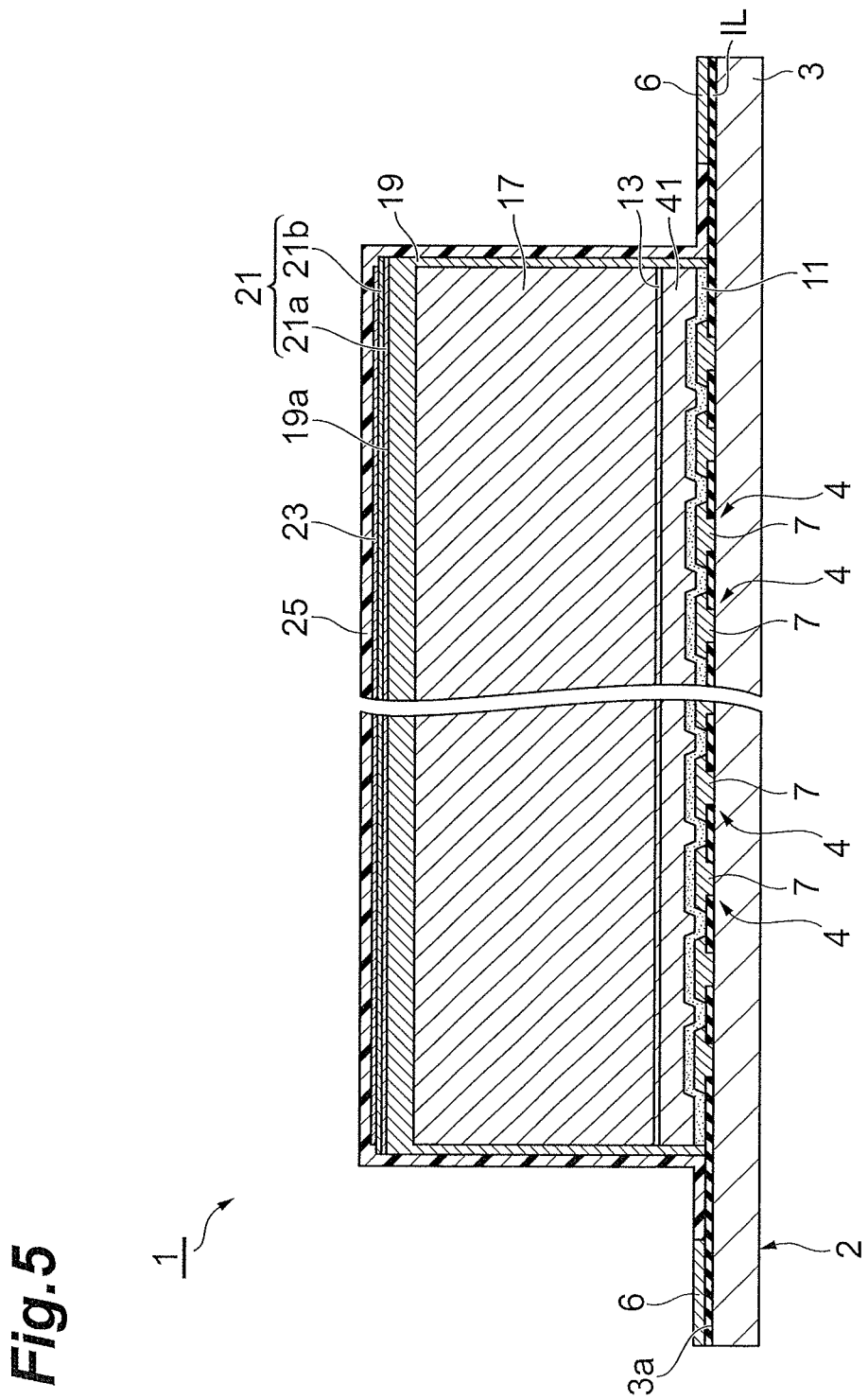
FIG. 5 is a view corresponding to FIG. 3 of the embodiment in an X-ray detector according to Comparative example 1.

FIG. 5 is a view corresponding to FIG. 3 of the present embodiment in an X-ray detector 1 according to Comparative example 1. The X-ray detector 1 of Comparative example 1 is greatly different from Example 1 in that a flattening layer 41 not containing lithium fluoride is provided separately between the crystallization suppressing layer 11 and the electric field relaxation layer 13 in comparison with Example 1 in which the electric field relaxation layer 13 commonly performs the flattening function, and the first thermal property enhancement layer 15 is not provided between the electric field relaxation layer 13 and the X-ray conversion layer 17. Further, detailed conditions of the respective layers are also different from those of Example 1. In Comparative example 1, first, on the surface 3a of the silicon substrate 3 of the signal readout substrate 2, the crystallization suppressing layer 11, the flattening layer 41, and the electric field relaxation layer 13 were formed according to the vacuum vapor deposition method etc., using a mask. Detailed conditions of the respective layers are as follows.

Figure 6:
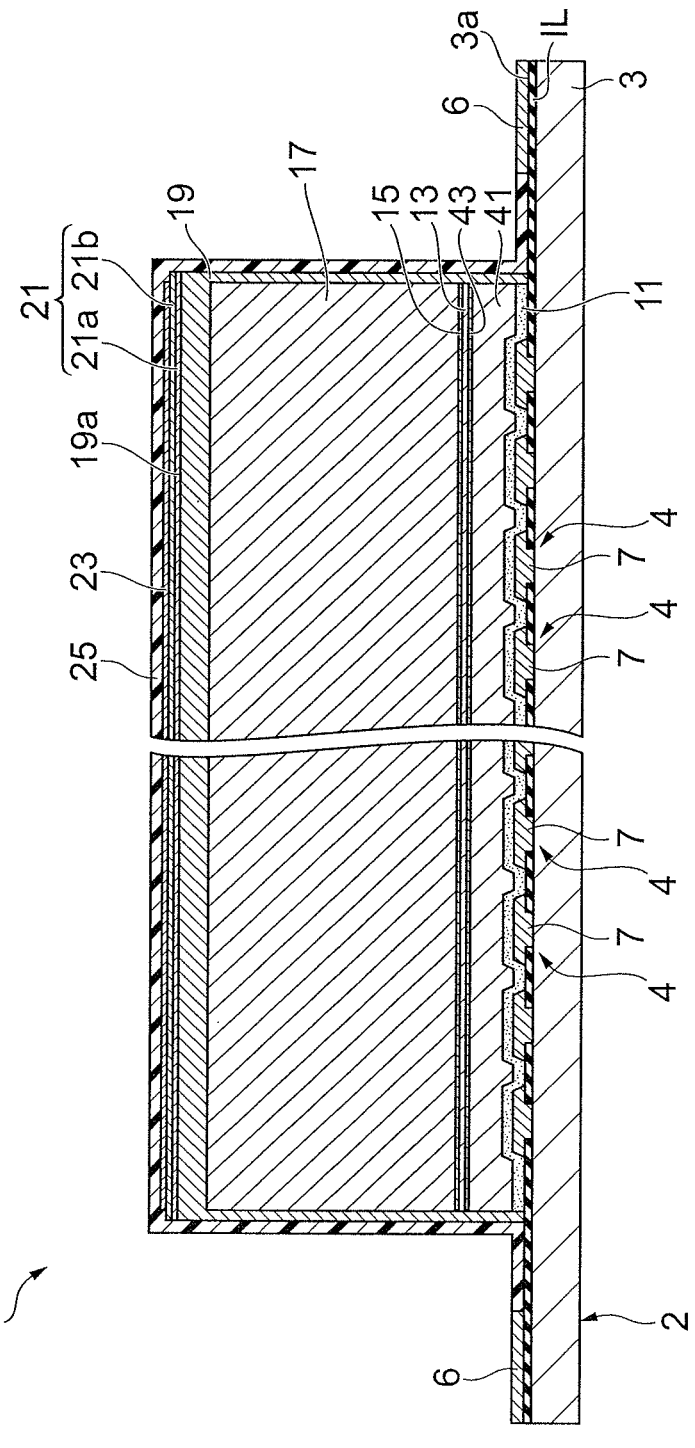
FIG. 6 is a view corresponding to FIG. 3 of the embodiment in an X-ray detector according to Comparative example 2.

Crystallization suppressing layer 11:
Material: amorphous selenium containing 40 atomic percent of arsenic
Thickness: 0.3 μm
Flattening layer 41:
Material: amorphous selenium containing 2 atomic percent of arsenic
Thickness: 5 μm
Electric field relaxation layer 13:
Material: amorphous selenium containing 1.2 weight percent of lithium fluoride
Thickness: 0.06 μm FIG. 6 is a view corresponding to FIG. 3 of the present embodiment in an X-ray detector 1 according to Comparative example 2. Similar to Comparative example 1, the X-ray detector 1 of Comparative example 2 is greatly different from Example 1 in that a flattening layer 41 not containing lithium fluoride is provided separately between the crystallization suppressing layer 11 and the electric field relaxation layer 13, the concentration of lithium fluoride in the electric field relaxation layer 13 is lower than in Example 1, and a third thermal property enhancement layer 43 is further provided between the electric field relaxation layer 13 and the flattening layer 41. Further, detailed conditions of the respective layers are also different from those of Example 1. In Comparative example 2, first, on the surface 3a of the silicon substrate 3 of the signal readout substrate 2, the crystallization suppressing layer 11, the flattening layer 41, the third thermal property enhancement layer 43, and the electric field relaxation layer 13 were formed by using the vacuum vapor deposition method etc., using a mask. Detailed conditions of the respective layers are as follows.

Crystallization suppressing layer 11:
Material: amorphous selenium containing 40 atomic percent of arsenic
Thickness: 0.3 μm
Flattening layer 41:
Material: amorphous selenium containing 2 atomic percent of arsenic
Thickness: 5 μm
Third thermal property enhancement layer 43:
Material: amorphous selenium containing 40 atomic percent of arsenic
Thickness: 30 nm
Electric field relaxation layer 13:
Material: amorphous selenium containing 0.5 weight percent of lithium fluoride
Thickness: 0.06 μm
First thermal property enhancement layer 15:
Material: amorphous selenium containing 40 atomic percent of arsenic
Thickness: 0.03 μm (Common Conditions)

In Example 1 and Comparative examples 1 and 2, after the respective layers were formed, the X-ray conversion layer 17 was formed according to the vacuum vapor deposition method etc., using a mask. Thereafter, the mask was removed and the second thermal property enhancement layer 19 was formed so as to cover the layers up to the X-ray conversion layer 17 formed on the signal readout substrate 2. Then, according to the vacuum vapor deposition method etc., the electron injection blocking layer 21 was formed by using a mask on the upper surface 19a of the second thermal property enhancement layer 19 and the common electrode 23 was formed so as to include the effective pixel region R on the electron injection blocking layer 21. Thereafter, the mask was removed and the protective layer 25 was formed so as to cover the formed layers. Detailed conditions of the respective layers are as follows.

X-ray conversion layer 17:
Material: amorphous selenium
Thickness: 200 μm
   Third thermal property enhancement layer 19:
Material: amorphous selenium containing arsenic
Thickness: 0.7 μm
   Electron injection blocking layer 21*a*:
Material: amorphous selenium containing not more than 5 atomic percent of arsenic
Thickness: 0.03 μm
   Electron injection blocking layer 21*b*:
Material: antimony trisulfide
Thickness: 0.03 μm
   Common electrode 23:
Material: gold (Au)
Thickness: 0.05 μm
   Protective layer 25:
Material: poly-para-xylylene resin
Thickness: 20 μm (Experiment Conditions of Comparative Example 3)

In Comparative example 3, an X-ray detector 1 having the same structure as that of Example 1 was formed according to the same method as in Example 1. However, Comparative example 3 is greatly different from Example 1 in that the first thermal property enhancement layer 15 was not formed and the electric field relaxation layer 13 did not contain arsenic. Detailed conditions of the respective layers are as follows.

Crystallization suppressing layer 11:
Material: amorphous selenium containing 40 atomic percent of arsenic
Thickness: 0.3 μm
   Electric field relaxation layer 13:
Material: amorphous selenium containing 0.15 weight percent of lithium fluoride
Thickness: 5 μm
   X-ray conversion layer 17:
Material: amorphous selenium
Thickness: 50 μm
   Second thermal property enhancement layer 19:
Material: amorphous selenium containing 40 atomic percent of arsenic
Thickness: 0.7 μm
   Electron injection blocking layer 21*a*:
Material: amorphous selenium containing not more than 5 atomic percent of arsenic
Thickness: 0.03 μm
   Electron injection blocking layer 21*b*:
Material: antimony trisulfide
Thickness: 0.03 μM
   Common electrode 23:
Material: Au
Thickness: 0.05 μm
   Protective layer 25:
Material: poly-para-xylylene resin
Thickness: 20 μm (Electric Field-Dark Current Density Characteristics Before and after Heat Treatment)

The electric field-dark current density characteristics of Example 1 and Comparative examples 1 to 3 were measured. Specifically, while the magnitude of the electric field to be applied to Example 1 and Comparative examples 1 to 3 was increased, the dark current density was measured. Thereafter, with respect to Comparative examples 1 to 3, the detectors were left for 30 hours in the atmosphere in an environment of 60° C., the same measurement was performed. Further, with respect to Example 1, the detector was left for 30 hours in the atmosphere in an environment at a higher temperature of 70° C. than the leaving temperature of Comparative examples 1 to 3, the same measurement was performed. The results are shown in FIG. 7 to FIG. 10. In all of FIG. 7 and FIG. 10, the horizontal axis indicates the applied electric field (V/μm), and the vertical axis indicates the measured dark current density (pA/mm$^2$).

(Evaluation and Results)

Figure 7:
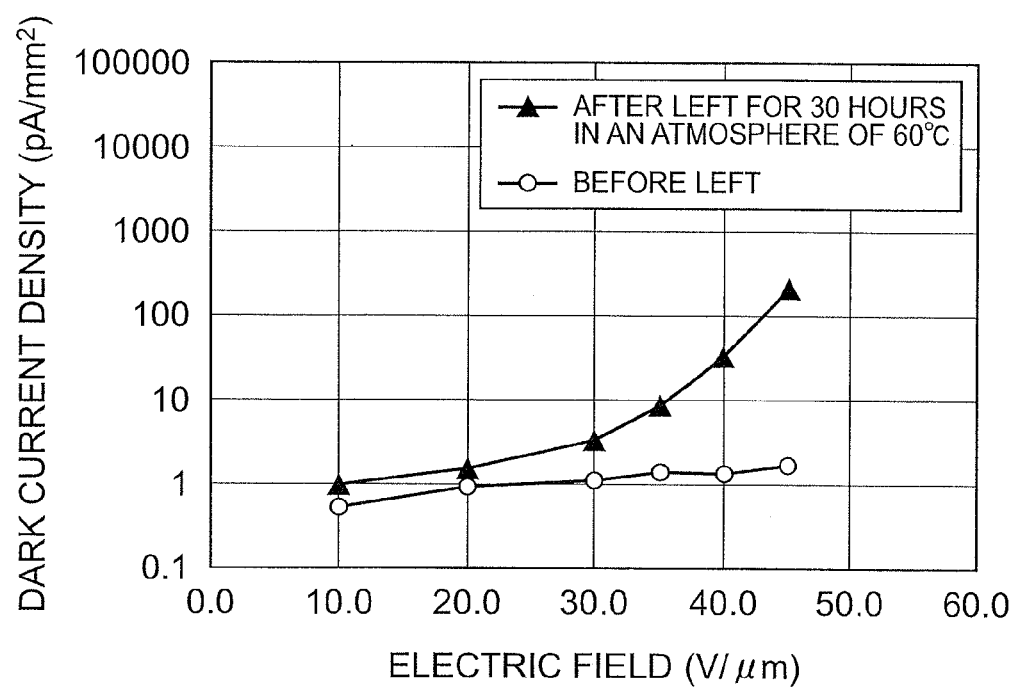
FIG. 7 is a view for describing operation and effect of the X-ray detector of the embodiment.

As shown in FIG. 7, in the case of Comparative example 1, in the range of the electric field from 10 V/μm to 20 V/μm, the dark current densities measured before and after the detector was left do not greatly differ from each other. However, it was confirmed that, when the electric field became not less than 20 V/μm, the dark current density flowing after the detector was left greatly increased in comparison with the dark current density before the detector was left. The possible reason for this is that the detector did not include the first thermal property enhancement layer 15 and therefore diffusion of lithium fluoride in the electric field relaxation layer 13 to the X-ray conversion layer 17 was not suppressed, and the thickness of the electric field relaxation layer 13 was thinner than in Example 1 and the flattening layer 41 did not contain lithium fluoride, so that the electric field reducing effect of lithium fluoride could not be sufficiently obtained.

Figure 8:
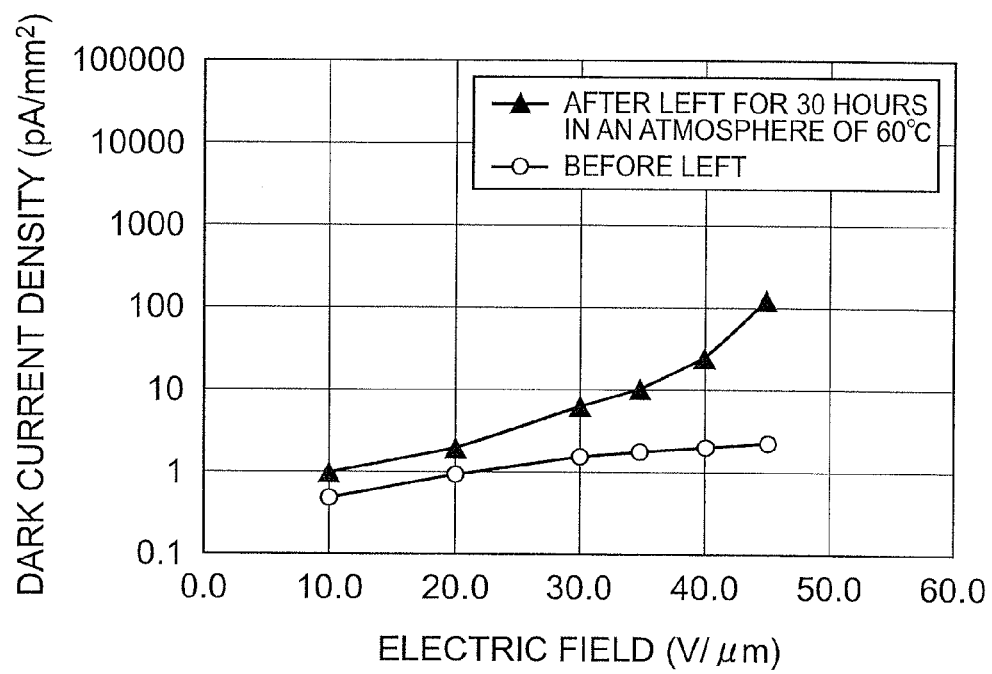
FIG. 8 is a view for describing operation and effect of the X-ray detector of the embodiment.

As shown in FIG. 8, also in Comparative example 2, in the range of the electric field from 10 V/μm to 20 V/μm, the dark current densities measured before and after the detector was left do not greatly differ from each other, however, it was confirmed that when the electric field became not less than 20 V/μm, the dark current density flowing after the detector was left greatly increased in comparison with before the detector was left. The possible reason for this is that although diffusion of lithium fluoride in the electric field relaxation layer 13 was suppressed by the first thermal property enhancement layer 15 and the third thermal property enhancement layer 43, the electric thickness of the electric field relaxation layer 13 was thinner and the concentration of lithium fluoride was lower than in Example 1, so that the electric field reducing effect of lithium fluoride could not be sufficiently obtained.

Figure 9:
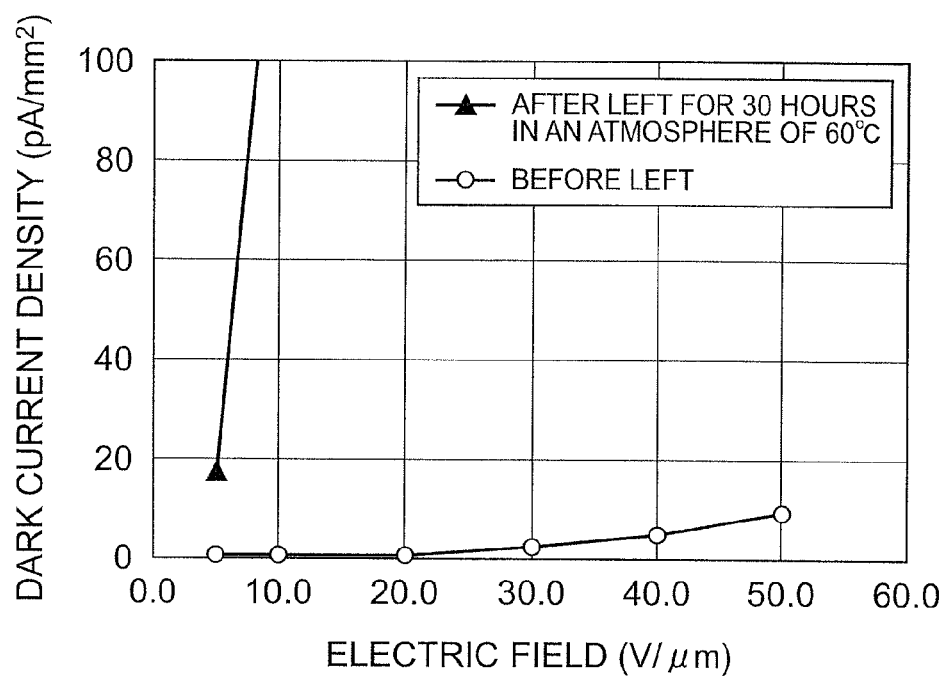
FIG. 9 is a view for describing operation and effect of the X-ray detector of the embodiment.

As shown in FIG. 9, in the case of Comparative example 3, it was confirmed that the dark current density flowing after the detector was left greatly increased in the entire electric field range in comparison with before the detector was left. The possible reason for this is that the detector did not include the first thermal property enhancement layer 15 and therefore diffusion of lithium fluoride in the electric field relaxation layer 13 to the X-ray conversion layer 17 was not suppressed, and the electric field relaxation layer 13 did not contain arsenic and the electric field reducing effect of lithium fluoride was not maintained.

Figure 10:
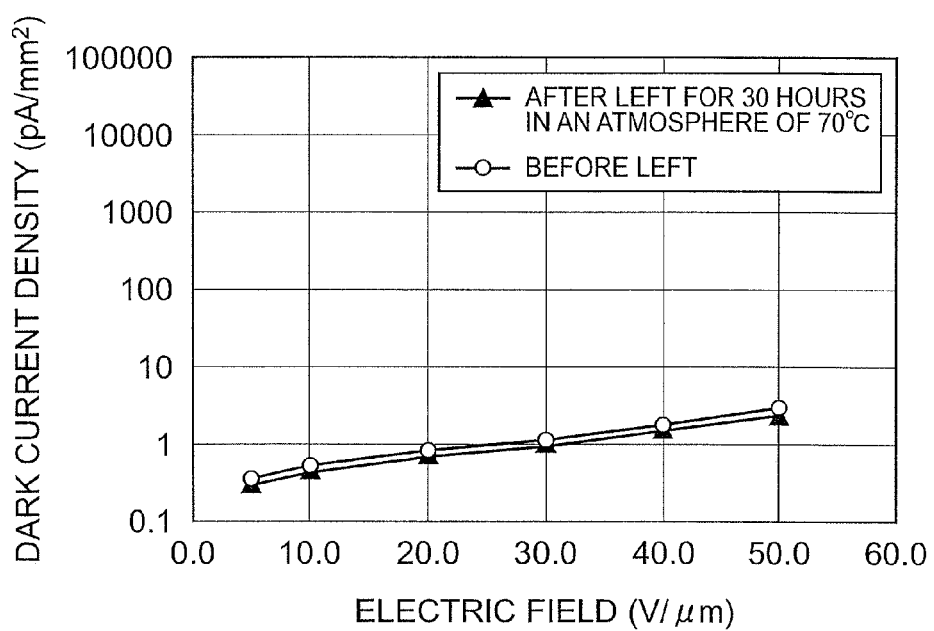
FIG. 10 is a view for describing operation and effect of the X-ray detector of the embodiment.

On the other hand, as shown in FIG. 10, in the case of Example 1, it was confirmed that, in the entire electric field range, the electric field-dark current density characteristics hardly change before and after the detector was left.

It was confirmed from Example 1 and Comparative examples 1 to 3 that, in the case of Example 1, the detector included the electric field relaxation layer 13 provided between the X-ray conversion layer 17 and the signal readout substrate 2 and containing not less than 0.5 atomic percent and not more than 5 atomic percent of arsenic and not less than 0.02 weight percent and not more than 5 weight percent of lithium fluoride, and the first thermal property enhancement layer 15 provided between the electric field relaxation layer 13 and the X-ray conversion layer 17 and containing not less than 10 atomic percent and not more than 40 atomic percent of arsenic, so that excellent heat resistance was obtained, and as a result, in the initial stage and before and after the detector was heated and left, dark currents were suppressed.

REFERENCE SIGNS LIST

1: radiation detector, 2: signal readout substrate, 3: silicon substrate, 7: pixel electrode, 13: field relaxation layer, 15: first thermal property enhancement layer, 17: X-ray conversion layer, 23: common electrode.

The invention claimed is:
1. The radiation detector comprising:
a charge generating layer which is made of amorphous selenium and absorbs incident radiation and generates charges;
a common electrode provided on the charge generating layer on the side on which the radiation is made incident;
a signal readout substrate on which a plurality of pixel electrodes for collecting charges generated by the charge generating layer are arrayed,
a first amorphous selenium layer provided between the charge generating layer and the signal readout substrate and containing arsenic and lithium fluoride;
a second amorphous selenium layer provided between the first amorphous selenium layer and the signal readout substrate and containing arsenic; and
a third amorphous selenium layer provided between the first amorphous selenium layer and the charge generating layer and containing arsenic,
wherein the second amorphous selenium layer and the third amorphous selenium layer contain not less than 10 atomic percent and not more than 40 atomic percent of arsenic.
2. The radiation detector comprising:
a charge generating layer which is made of amorphous selenium and absorbs incident radiation and generates charges;
a common electrode provided on the charge generating layer on the side on which the radiation is made incident;
a signal readout substrate on which a plurality of pixel electrodes for collecting charges generated by the charge generating layer are arrayed,
a first amorphous selenium layer provided between the charge generating layer and the signal readout substrate and containing arsenic and lithium fluoride;
a second amorphous selenium layer provided between the first amorphous selenium layer and the signal readout substrate and containing arsenic; and
a third amorphous selenium layer provided between the first amorphous selenium layer and the charge generating layer and containing arsenic,
wherein the third amorphous selenium layer contains not less than 0 weight percent and not more than 5 weight percent of lithium fluoride.
3. A radiation detector comprising:
a charge generating layer which is made of amorphous selenium and absorbs incident radiation and generates charges;
a common electrode provided on the charge generating layer on the side on which the radiation is made incident;
a signal readout substrate on which a plurality of pixel electrodes for collecting charges generated by the charge generating layer are arrayed,
a first amorphous selenium layer provided between the charge generating layer and the signal readout substrate and containing arsenic and lithium fluoride;
a second amorphous selenium layer provided between the first amorphous selenium layer and the signal readout substrate and containing arsenic;
a third amorphous selenium layer provided between the first amorphous selenium layer and the charge generating layer and containing arsenic;
a fourth amorphous selenium layer covering top and side surfaces of the charge generating layer.
4. A radiation detector according to claim 3,
wherein the fourth amorphous selenium layer covers side surfaces of the first, second and third amorphous selenium layers.
5. The radiation detector according to claim 3,
wherein the atomic concentrations of arsenic contained in the second amorphous selenium layer and the third amorphous selenium layer are higher than the atomic concentration of arsenic contained in the first amorphous selenium layer.
6. The radiation detector according to claim 3,
wherein the second amorphous selenium layer and the third amorphous selenium layer contain not less than 10 atomic percent and not more than 40 atomic percent of arsenic.
7. The radiation detector according to claim 3,
wherein the first amorphous selenium layer contains not less than 0.5 atomic percent and not more than 5 atomic percent of arsenic.
8. The radiation detector according to claim 3,
wherein the first amorphous selenium layer contains not less than 0.02 weight percent and not more than 5 weight percent of lithium fluoride.
9. The radiation detector according to claim 3,
wherein the third amorphous selenium layer contains not less than 0 weight percent and not more than 5 weight percent of lithium fluoride.
10. The radiation detector according to claim 3,
wherein the film thickness of the second amorphous selenium layer is larger than the film thickness of the third amorphous selenium layer.

* * * * *